United States Patent [19]

Ueno

[11] Patent Number: 5,021,846
[45] Date of Patent: Jun. 4, 1991

[54] MOS SEMICONDUCTOR DEVICE WITH AN INVERTED U-SHAPED GATE

[75] Inventor: Katsunori Ueno, Kanagawa, Japan
[73] Assignee: Fuji Electric Co., Ltd., Kawasaki, Japan
[21] Appl. No.: 475,713
[22] Filed: Feb. 6, 1990
[30] Foreign Application Priority Data Feb. 6, 1989 [JP] Japan ................................. 1-26945

[51] Int. Cl.$^5$ ...................... H01L 29/10; H01L 29/78; H01L 27/02; H01L 29/04
[52] U.S. Cl. .................................... 357/23.4; 357/41; 357/59; 437/203
[58] Field of Search ...................... 357/23.4, 23.5, 23.6

[56] References Cited

U.S. PATENT DOCUMENTS

| 4,697,201 | 9/1987 | Mihara | 357/23.4 |
| 4,830,978 | 5/1989 | Teng et al. | 357/23.4 |
| 4,881,105 | 11/1989 | Davari et al. | 357/23.4 |

FOREIGN PATENT DOCUMENTS 57-35591 7/1982 Japan.
63-8624 2/1988 Japan.

OTHER PUBLICATIONS

"V-MOS Makes Gains in Power Devices at General Electric, in Frequency at Tectronix", Electronics, vol. 51, No. 23, Nov. 9, 78, pp. 40–41.
Scharf, B. W., "A MOS-Controlled Triac Device", IEEE International and Solid State Circuits Conference, Feb. 1978, pp. 222–223.

Primary Examiner—Andrew J. James
Assistant Examiner—Cynthia S. Deal
Attorney, Agent, or Firm—Brumbaugh, Graves, Donohue & Raymond

[57] ABSTRACT

Provided is a metal oxide semiconductor with an inverted U-shaped recess formed therein, the recess having two relatively deep outside channels and an interconnecting relatively shallow channel. The recess is filled with polycrystalline silicon gate material, and when biased, a conductive region is formed alongside an outside channel. Also provided also is a method of forming such an inverted U-shaped recess in a metal oxide semiconductor.

9 Claims, 2 Drawing Sheets

MOS SEMICONDUCTOR DEVICE WITH AN INVERTED U-SHAPED GATE

BACKGROUND OF THE INVENTION

The present invention relates to a MOS semiconductor device, such as a MOSFET, for power and conductivity modulation-type MOSFETs (hereinafter designated as insulation gate bipolar transistors, or IGBTs) in which a U-shaped recess is formed in the semiconductor substrate so that the MOSFET channel is vertically oriented to the substrate surface.

In power MOSFETs and IGBTs, in conventional vertical power elements in which the main current runs vertically to the substrate, researchers have in the past tried to heighten the integrity density to reduce the element resistance while the device is in the ON state.

One way of doing this is to form a V-shaped recess on the substrate surface. But since the area utilization rate cannot be increased because of the V-shaped construction of the gate cut, U-shaped structures, as in Japanese Patents 1982-35591 and 1988-8624, have been proposed.

FIG. 2 shows a sectional view of a vertical MOSFET for power having a U-shaped structure. A U-shaped recess 4 of width A and depth B is formed from the surface on the P-base layer 3 of the silicon substrate having an N+ drain layer 2 and a P-base layer 3 with an N-layer 1 of low impurity concentration placed in between. On the surface of the P-base layer 3, an N+ source layer contacts the recess 4, and a polycrystalline silicon gate 7 is placed inside through an insulation film 6. A source electrode 8 contacts the P-base layer 3 and the source layer 5 which are not coated with an insulation film 5, and a drain electrode 9 contacts the N+ drain layer 2. In the element of this structure, an N-channel is formed between the source layer 5 of the P-base layer 3 which contacts the side wall of the recess 4 and the N-layer 1 by applying a voltage to the gate 7 to allow current flow. Since in this structure the channel is formed on the surface of the recess's side wall, it provides a higher area utilization rate for main current flow.

The thickness of the P-base layer 3 shown in FIG. 2 is approximately about 1-2 $\mu$m in the case of power MOSFETs. In IGBTs, however, the layer is thicker, sometimes as much as 3-8 $\mu$m.

Accordingly, the U-shaped recess 4 should be deep, and must be approximately 3-8 $\mu$m. Wafer processing becomes difficult at such depths, however. With deep channels it is difficult to obtain uniform photo resist coatings and to match the photo-process mask, which deteriorates matching accuracy.

As shown in FIG. 2, one solution is to use polycrystalline silicon as a filler to make the surface even. Techniques for achieving evenness are well known in the field of LSI processing. Such techniques are used to fill memory cells in trenches with polycrystalline silicon, and to prevent cuts in electrode wiring made when the steps are formed. An example of this technology is shown in FIG. 3. In this method, a recess 32 in a substrate 31 is filled with polycrystalline silicon 33, then excess silicon is cut off to obtain an even surface. The recess 32 of width A and depth B, as shown in FIG. 3(a), filled with polycrystalline silicon 33 applied to a thickness over half the length of the width A. After filling the recess, etching is performed over the entire surface to obtain a flat configuration, as shown in FIG. 3(c). With this method, polycrystalline silicon approximately 1 $\mu$m thick is enough for memory cells in trenches, where A is approximately 1 $\mu$m and B is approximately 4 $\mu$m. But in power MOSFETs and IGBTs like those shown in FIG. 2, A is as wide as 10-20 $\mu$m of polycrystalline silicon. Another way to obtain even surfaces is by the steps shown in FIG. 3(b). In this method, polycrystalline silicon 33 is applied to a thickness greater than depth B. After coating resist, liquid glass, or the like is used to smooth the irregular surface of the polycrystalline silicon, uniform etching is performed over the entire surface to finally make the surface even. Even with this method, it is difficult to apply polycrystalline silicon to a thickness of 3-8 $\mu$m when B is 3-8 $\mu$m.

The object of this invention is to provide MOS semiconductor device in which surface evenness of the recess filled with polycrystalline silicon is easily achieved.

SUMMARY OF THE INVENTION

To obtain the aforementioned object, the MOS semiconductor device of this invention consists of a recess which is formed by an inside shallow channel connecting two outside channels. The outside channels are formed from the surface of the semiconductor substrate, and the inside surface of the recess is covered with an insulation film. The space enclosed by the inside surface, covered with polycrystalline silicon or some other insulation film, is filled to form a gate to which voltage can be applied. A source layer of a different conductivity type is provided so that it contacts the side wall surface of the outside deep channel formed in the semiconductor substrate.

The process in which a channel, having a source layer at its one end, is formed via an insulation film formed on the outside wall of the deeper channel in the semiconductor substrate by applying a voltage to a gate is the same process as that used in the conventional MOS semiconductor devices having a U-shaped recess. With this process, it is possible to fill both channels having narrower and deeper dimensions and a shallower channel in between them with a thin application of polycrystalline silicon. Accordingly, it is easy to achieve even surfaces on recesses that are as deep as 3-8 $\mu$m.

The foregoing and other objects, features and advantages of the invention will become apparent from the following more particular description of the preferred embodiments of the invention, as illustrated in the accompanying drawing.

PREFERRED EMBODIMENT OF THE INVENTION

Figure 1:
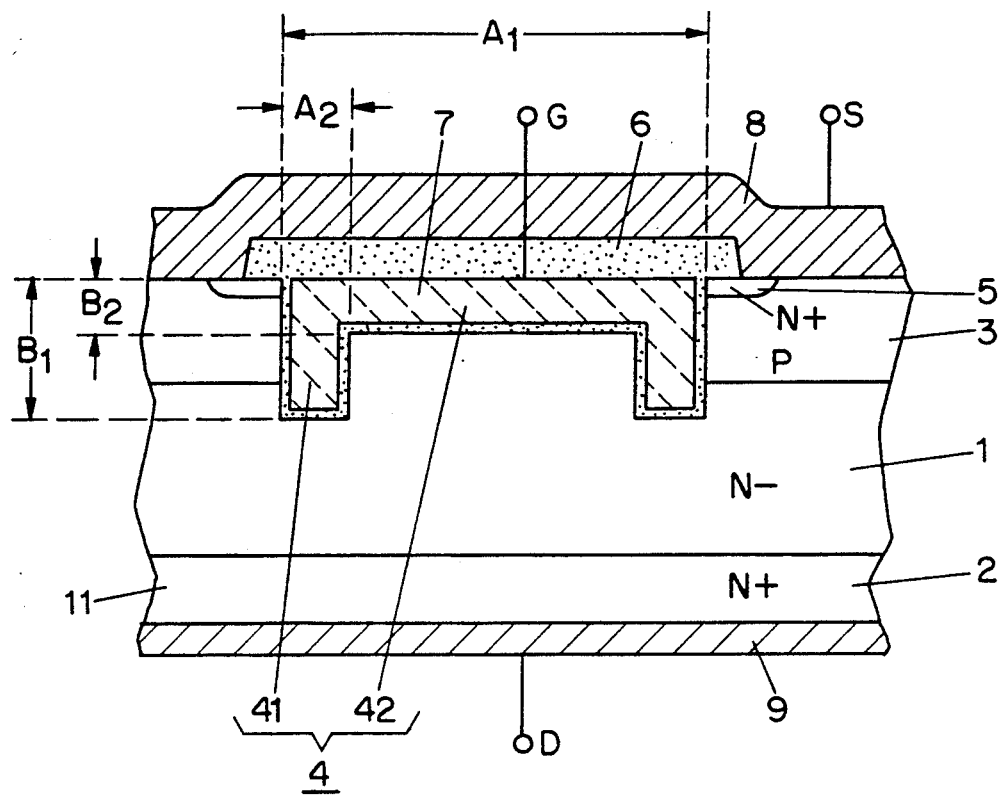
FIG. 1 shows a sectional view of a vertical power MOSFET as a preferred embodiment of the present invention.
Figure 2:
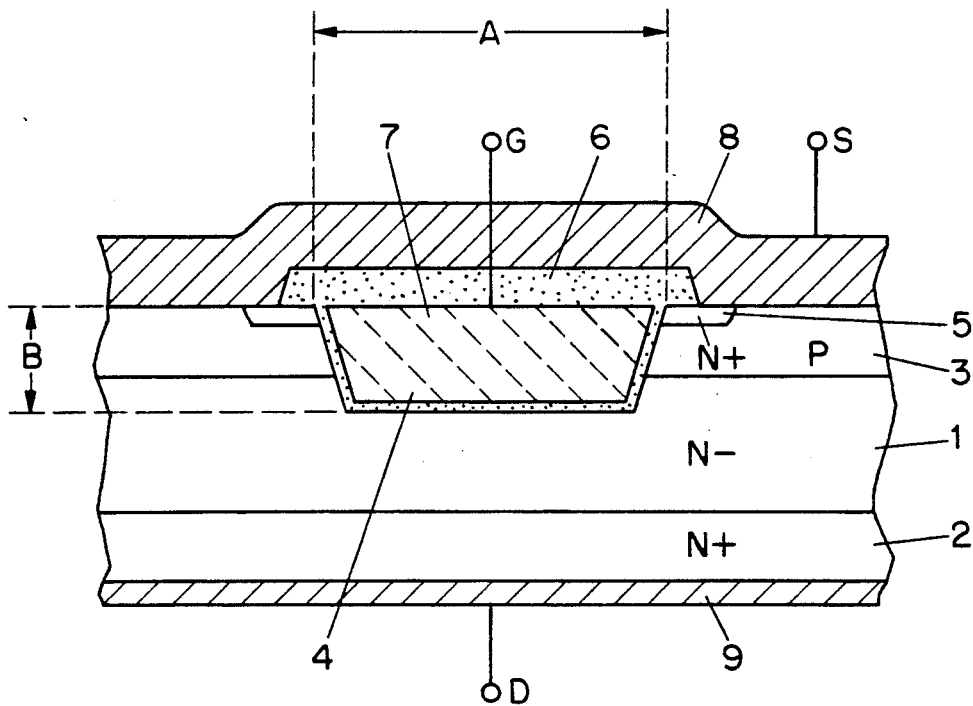
FIG. 2 shows a sectional view of a conventional power MOSFET that has a U-shaped recess.
Figure 3A:
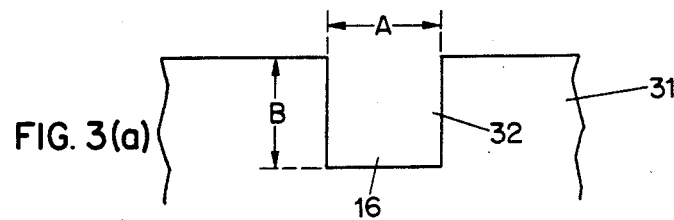
FIGS. 3(a) through (c) show a sectional view of a sample process to make the surface of the recess area in the substrate smooth.
Figure 3B:
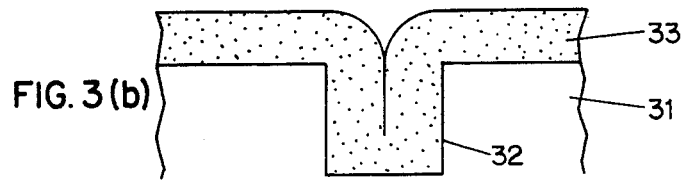
Figure 3C:
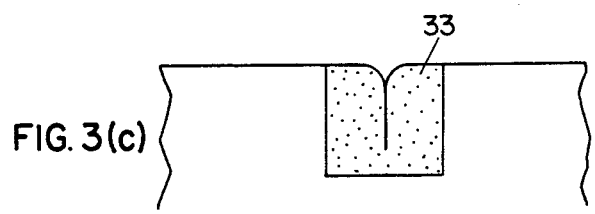

FIG. 1 shows a preferred embodiment of the vertical MOSFET of this invention. The same reference numerals as used in FIG. 2 are used for areas common to both figures. In FIG. 1, the recess 4 is an inverted U-shape, and the recess 4 to form channels at its outside walls is composed of a channel 41 of depth $B_1$ and width $A_2$. Inside this channel, a channel 42 of shallower depth $B_2$ is formed to connect to channel 41. Otherwise, the structure is exactly the same as that of the conventional element shown in FIG. 2. polycrystalline silicon gate gate made of semiconductor material, shown in FIG. 2 as a 7, in the recess 4 of this element, channels 41 and 42 must be filled with polycrystalline silicon. To do that, it is sufficient to fill the polycrystalline silicon to half width $A_2$ of the deeper channel 41, or to a thickness greater than depth $B_2$ of the shallower channel. Since it is possible to make both $A_2$ and $B_2$ several $\mu$m, however, several $\mu$m of polycrystalline silicon is enough. Therefore, it is possible to make the recess's width $A_1$ and maximum depth $B_1$ of any dimension, and to increase the area utilization rate.

Figure 4A:
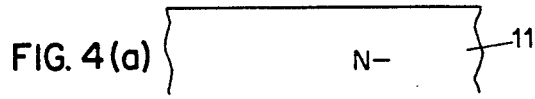
FIGS. 4(a) through (i) show a sectional view of a sequential process for forming a gate area for the MOSFET.
Figure 4B:
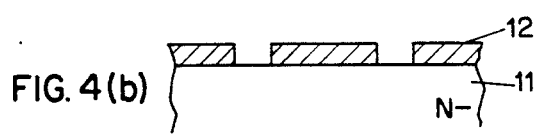

FIGS. 4(a)-(i) shows the process by which the gate for the element described above is formed. Patterning, as shown in FIG. 4(b), is performed after forming an oxide film 12 over the surface of the N- silicon substrate 11 shown in FIG. 4(a).

Figure 4C:
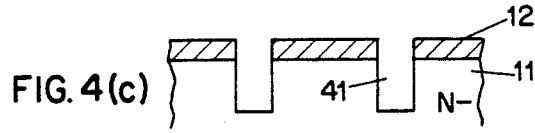

Since this oxide film 12 is used as a mask for etching, a nitrated film can be substituted. Using this mask, the deeper channel 41 is dry-etched first, as shown in FIG. 4(c).

Figure 4D:
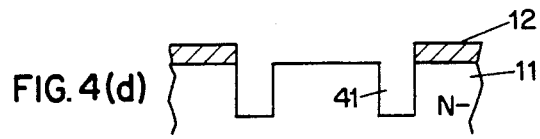
Figure 4E:
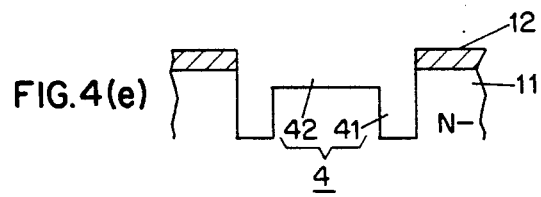
Figure 4F:
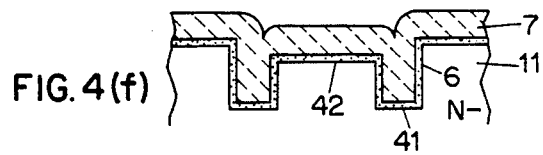
Figure 4G:
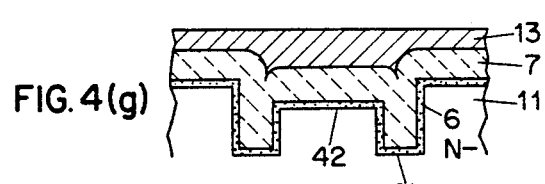
Figure 4H:
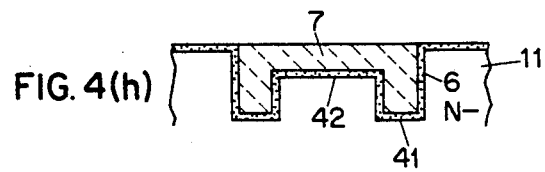
Figure 4I:
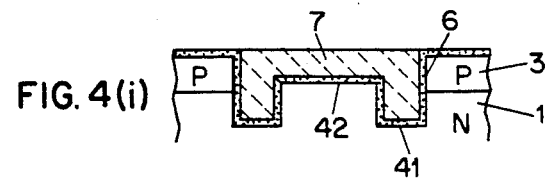

In FIG. 4(d), the center of the mask 12 is removed, and the recess 4 which has a shallow channel 42 and a deeper channel 41 is formed by etching, as shown in FIG. 4(e). Then the mask 12 is removed to coat an oxide film 6 or other insulation film over the semiconductor surfaces, including the inner wall surfaces of the recess 4. The recess 4 is then completely filled with polycrystalline silicon 7 up to half of the width of the deeper channel 41 or to a thickness equivalent to the depth of the shallower channel 42, as shown in FIG. 4(f). At this time, a step is formed on the surface, and the step's height equals the depth of the shallower channel 42. Then, in FIG. 4(g), a resist film 13 is coated over the surface to make the surface smooth, and the surface of the polycrystalline silicon gate 7 is made flush with the oxide film coated on the surface of substrate 11 by uniform etching. The processes after this are the same as those done for conventional vertical MOSFETs, in which a P-base layer 3 is formed by dispersing impurities. After this, though there are forming processes such as dispersion of a source layer 5 and a drain layer 2, formation of an insulation film 6 over the gate, and formation of metallic electrodes 8 and 9, they will be omitted here because they are well known in the art and not directly related to this invention. For reference, if an N+ layer 2 of the drain side is substituted by a p+ layer, an IGBT is obtained.

With the present invention, it becomes possible to fill a recess with even a thin application of polycrystalline silicon by inverting a U-shaped recess that consists of a deeper channel and a shallower channel and accommodates a gate. In this way, a channel penetrating deeper areas of the substrate can be made, and surface evenness is easily obtained. The area utilization rate of the substrate is thereby improved, and this helps increase the interaction density of the MOS semiconductor device.

The foregoing description of the preferred embodiment of the invention has been presented for the purposes of illustration and description. It is not intended to be exhaustive or to limit the invention to the pre-use form disclosed. Many modifications and variations are possible in light of the above teaching. It is intended that the scope of the invention be limited not by this detailed description, but rather by the claims appended hereto.

I claim:

1. A metal oxide semiconductor device, having a gate formed in an inverted U-shaped recess with a depth and width of said recess exceeding the limited thickness of the semiconductor layer applied to form said gate, comprising:

a semiconductor substrate having an inverted U-shaped recess formed of an inside channel of a first depth below the surface of said substrate connecting two outside channels whose depth below said surface substantially exceeds said first depth of said inside channel;

an insulative film covering the surface of said recess;

a gate formed by said limited thickness of semiconductor material within said recess in contact with said insulative film and filling said inside and outside channels to substantially said substrate surface;

a base layer formed at the surface of said substrate adjacent to and in contact with said insulative film and having a thickness less than the depth of said outside channels; and a source layer at the surface of said base layer adjacent to and in contact with said insulative film and having a thickness less than the thickness of said base layer, whereby a vertical conducting path adjacent to said insulating film is formed upon biasing said gate, and the semiconductor device is enabled to operate with a higher area utilization rate for main current flow.

2. The metal oxide semiconductor device of claim 1 in which the thickness of the base layer is within the range of 3-8 $\mu$m and the width of the inverted U-shaped recess is in the range of 10-20 $\mu$m.

3. The metal oxide semiconductor device of claim 1 in which the thickness of the base layer is within the range of 3-8 $\mu$m.

4. The metal oxide semiconductor device of claim 1 in which the width of the inverted U-shaped recess is in the range of 10-20 $\mu$m.

5. The metal oxide semiconductor device of claim 1 in which the insulation film is a oxide film.

6. The metal oxide semiconductor device of claim 1 in which the semiconductor material within the recess is polycrystalline silicon.

7. The metal oxide semiconductor device of claim 1 in which the base layer is p-type material and the source layer is N-type material.

8. The metal oxide semiconductor device of claim 1 further comprising a planar insulative film covering the exposed surface of said gate and partially covering said source layer.

9. The metal oxide semiconductor of claim 8 further comprising a source electrode in contact with said planar insulative film and said source layer.

* * * * *